(12) United States Patent
Autry

(10) Patent No.: US 8,003,446 B2
(45) Date of Patent: Aug. 23, 2011

(54) FLEXIBLE DIODE PACKAGE AND METHOD OF MANUFACTURING

(75) Inventor: Tracy Autry, Trabuco Canyon, CA (US)

(73) Assignee: Microsemi Corporation, Irvine, CA (US)

( * ) Notice: Subject to any disclaimer, the term of this patent is extended or adjusted under 35 U.S.C. 154(b) by 36 days.

(21) Appl. No.: 12/589,682

(22) Filed: Oct. 27, 2009

(65) Prior Publication Data

US 2010/0136748 A1    Jun. 3, 2010

Related U.S. Application Data

(63) Continuation-in-part of application No. 12/315,741, filed on Dec. 5, 2008, which is a continuation-in-part of application No. 11/728,624, filed on Mar. 27, 2007.

(60) Provisional application No. 61/197,456, filed on Oct. 27, 2008, provisional application No. 60/919,794, filed on Mar. 23, 2007.

(51) Int. Cl.
*H01L 21/00* (2006.01)

(52) U.S. Cl. ........ 438/123; 438/106; 438/124; 438/125; 257/E21.499; 257/E21.5; 257/E21.506

(58) Field of Classification Search ............... 257/E21.5, 257/E21.513
See application file for complete search history.

(56) References Cited

U.S. PATENT DOCUMENTS

2005/0167821 A1 * 8/2005 Mamitsu et al. ............... 257/718
* cited by examiner

*Primary Examiner* — Cheung Lee
(74) *Attorney, Agent, or Firm* — Robert C. Klinger

(57) ABSTRACT

A single step packaging process that both melts a solder and also cures an adhesive about a microelectronic circuit. The process finds technical advantages by simplifying packaging of a die that may be coupled to a planar flexible lead, which leads to a lower production cost and quicker manufacturing time. The planar flexible lead may be adapted to bend and flex during mechanical stress and during extreme temperature cycling, and allow direct mounting of the device to a member by easily welding or soldering. The invention may comprise a flexible solar cell diode that can be closely positioned on solar panels at an extremely low cost.

20 Claims, 6 Drawing Sheets

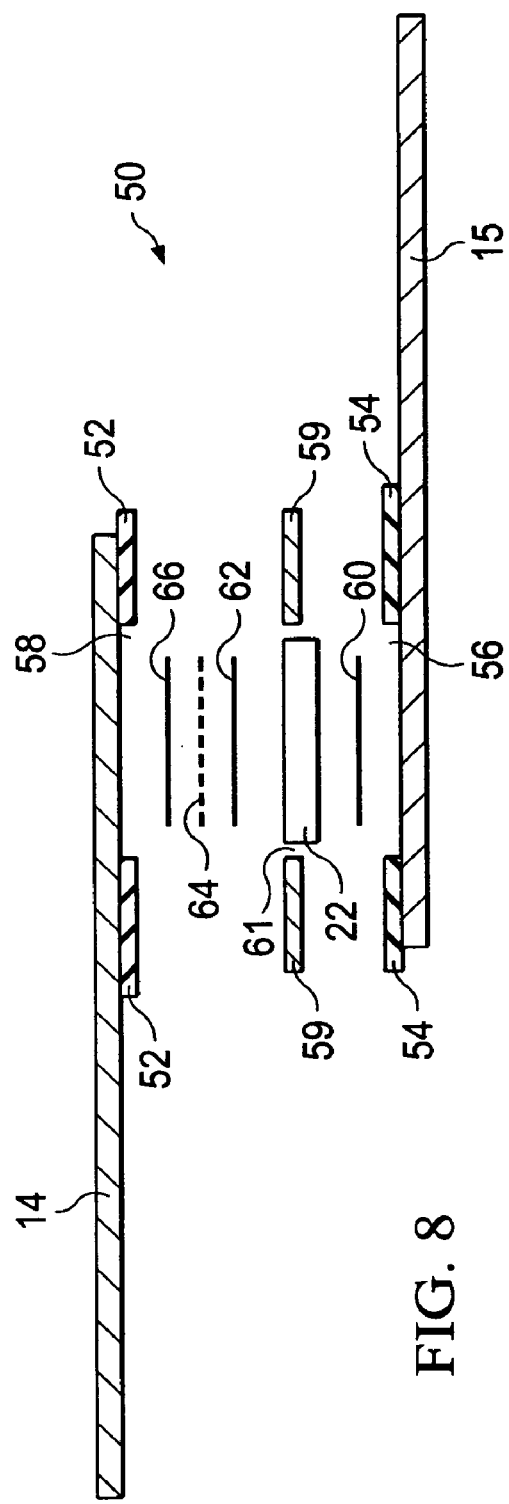
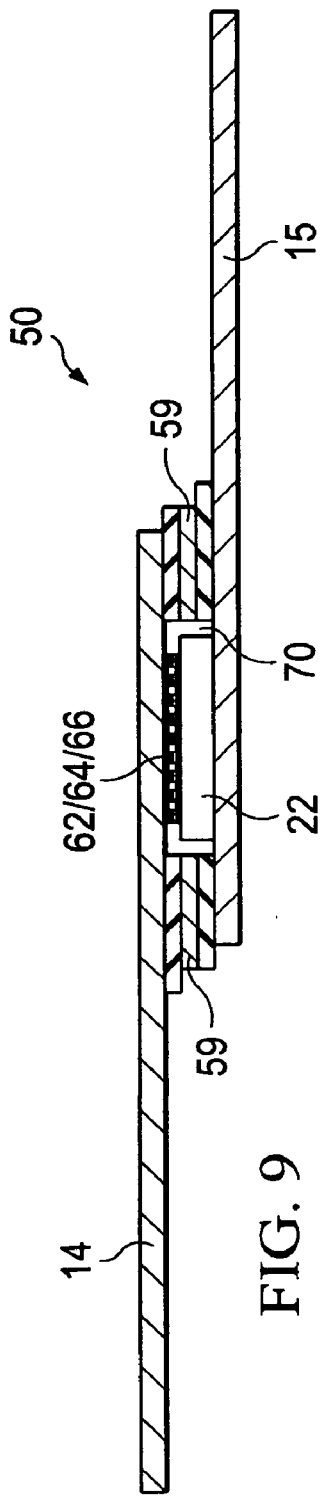
FIG. 8
FIG. 9

FLEXIBLE DIODE PACKAGE AND METHOD OF MANUFACTURING

PRIORITY CLAIM

This application claims priority of U.S. Provisional Patent Application Ser. No. 61/197,456 entitled "Flexible Diode Package and Method of Manufacturing" filed on Oct. 27, 2008, and is a Continuation-in-Part of U.S. patent application Ser. No. 12/315,741 entitled "Improved Integrated Circuit with Flexible Planer Leads" filed on Dec. 5, 2008 which is a Continuation-in-Part of U.S. patent application Ser. No. 11/728,624, entitled "Integrated Circuit with Flexible Planar Leads" filed on Mar. 27, 2007 which claims priority of U.S. Provisional Patent Application Ser. No. 60/919,794 entitled "Integrated Circuit with Flexible Planar Leads" filed on Mar. 23, 2007.

FIELD OF THE INVENTION

The present invention is generally directed to integrated circuits, and more particularly to integrated circuit packages and methods of manufacture including diodes that are adapted to withstand extreme thermal cycling, such as that incurred space or desert environments, such as in solar panels.

BACKGROUND OF THE INVENTION

As the popularity of solar panels continues to grow, expensive failures have been occurring at an ever increasing rate due to the prolonged effects of thermal expansion and the limited life cycles of solar panel components. All materials have a coefficient of thermal expansion, which is a thermal index indicating the relative degree a material expands or contracts as a function of temperature. Materials contract as they are cooled, and expand as they are warmed. Therefore, microelectronic devices employ materials with similar coefficients of thermal expansion that they can withstand extreme thermal cycling. In both space and terrestrial applications, an integrated circuit includes a solar cell diode which may be joined to a solar cell panel. These solar cell devices are comprised of a semiconductor material and are soldered to the solar panel, and interconnected to other circuits using rigid materials, such as rigid axial leads. These rigid axial leads can tolerate extreme thermal cycling for a period of time, but have a limited life cycle, and were designed for solder attachment to the solar panel. The solder joint in this design has limited thermal cycling capability due to thermal expansion mismatch, solder re-crystallization, and solder creep. Cracking in the solder joint is then followed by an electrical disconnect with the circuit. There is desired an improved microelectronic device adapted to withstand extreme thermal cycling, such as that encountered in a space or desert environment.

In addition, there is desired an improved method of manufacture that reduces the number of steps to package integrated circuits. For instance, some processes have separate sealing and soldering steps.

SUMMARY OF INVENTION

The present invention achieves technical advantages as a single step packaging process that both melts a solder and also cures an adhesive about a microelectronic circuit. The process finds technical advantages by simplifying packaging of a die that may be coupled to a planar flexible lead, which leads to a lower production cost and quicker manufacturing time. The planar flexible lead may be adapted to bend and flex during mechanical stress and during extreme temperature cycling, and allow direct mounting of the device to a member by easily welding or soldering. The invention may comprise a flexible solar cell diode that can be closely positioned on solar panels at an extremely low cost.

BRIEF DESCRIPTION OF THE DRAWINGS

FIG. 8 is a side exploded view of a microelectronic package integrated according to an improved process that combines a solder melt process with curing an adhesive according to another aspect of the present invention;

FIG. 9 is a side sectional view of the microelectronic package assembled according to the arrangement and process depicted in FIG. 8.

DETAILED DESCRIPTION OF THE PRESENT INVENTION

Figure 1:
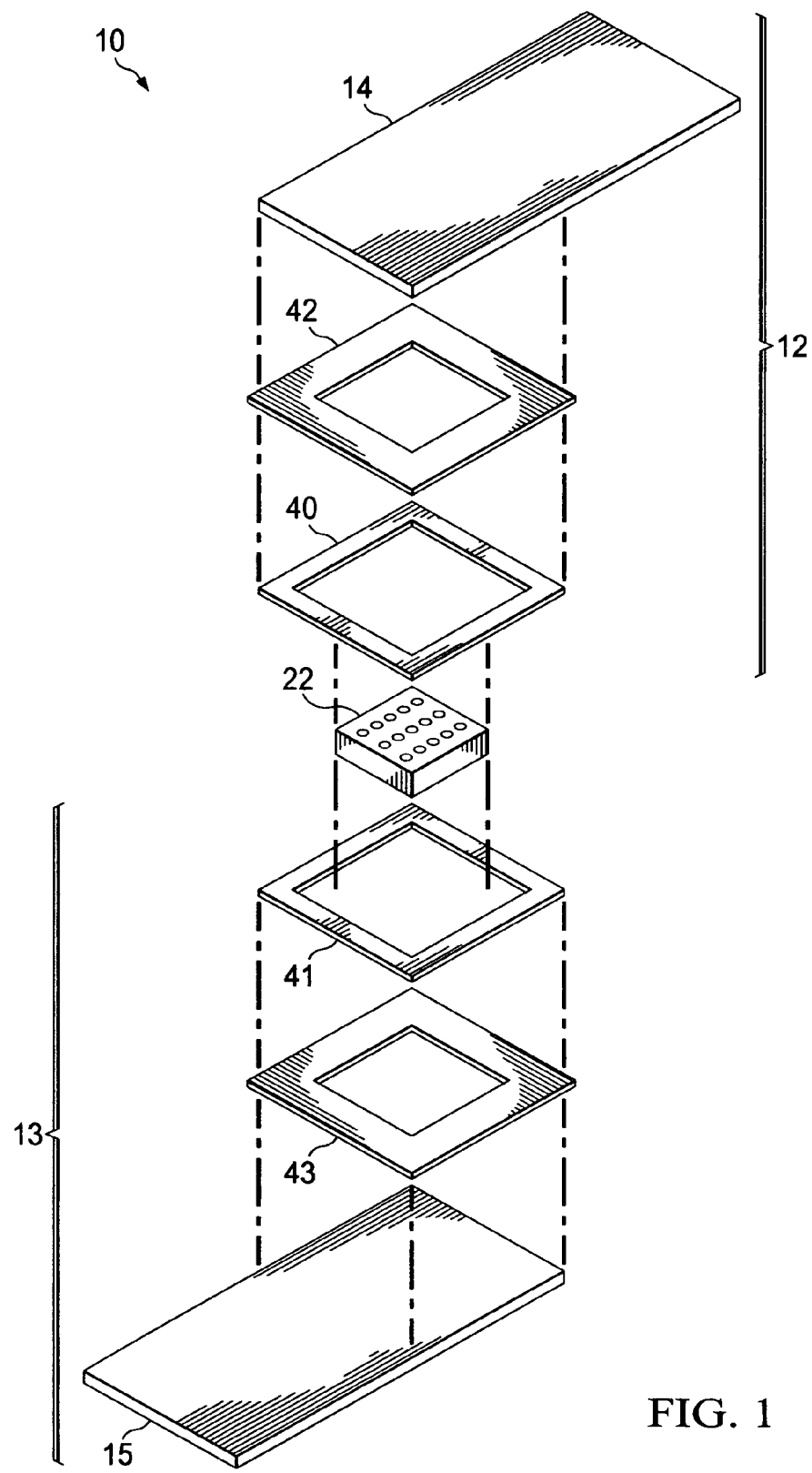
FIG. 1 is an exploded perspective view of a microelectronic package having a planar flexible lead according to one embodiment of the invention.

The numerous innovative teachings and aspects of the present invention will be described with particular reference to the following exemplary embodiments. However, it should be understood that this class of embodiments provides only a few examples of the many advantageous uses and innovative teachings of the inventor. In general, statements made in the specification of the present application do not necessarily delimit any of the various claimed inventions. Moreover, some statements may apply to some inventive features, but not to others.

Microelectronic devices are typically comprised of an integrated circuit diode die encompassed in a package having a plurality of external leads permitting electrical attachment to a printed circuit board. These microelectronic devices are available as commercial devices, and some are available as high reliability devices such as used in military applications, including those integrated in space environments, such as satellites, space vehicles and solar panels. In space environments, microelectronic devices need to withstand extreme thermal cycling, such as from −197° C. to +150° C. However, in extreme terrestrial environments, such as desert environments which are optimally suited for solar panel installation, microelectronic devices only need to withstand extreme thermal cycling from −20° C. to +80° C. While desert environments can see extreme temperature fluctuations every 24 hours, the expensive components required to withstand thermal cycling ranges in space are not needed for terrestrial applications. A lower cost microelectronic device for terrestrial applications that can be mass produced is desired.

All materials have a coefficient of thermal expansion, which is a thermal index indicating the relative degree a material expands or contracts as a function of temperature. Materials contract as they are cooled, and expand as they are warmed. Therefore, microelectronic devices employ materials with similar coefficients of thermal expansion that they can withstand extreme thermal cycling. Portions of the device having similar coefficients of thermal expansion are secured to one another using adhesive, paste, solder and so forth to avoid separation during thermal cycling.

In terrestrial applications, one typical integrated circuit includes a solar cell by-pass diode which may be joined to a solar cell panel. These terrestrial solar cell diodes are also subject to severe thermal cycling environments given their exposure to the sun and subsequent shading therefrom numerous times over their life cycle. Conventionally, these solar cell devices are comprised of semiconductors and are soldered or welded to the solar panel, and interconnected to other circuits using rigid materials, such as rigid axial leads. These rigid leads can tolerate the extreme thermal cycling for a period of time, but have a limited life cycle. These axial leaded devices were designed for solder attachment to the solar panel. The solder joint in this design has limited thermal cycling capability due to thermal expansion mismatch, solder re-crystallization, and solder creep. Cracking it the solder joint is then followed by an electrical disconnect with the circuit.

More recently, solar panel manufacturers have switched to attaching the axial leaded devices using a welded connection. The axial leads do not lend themselves to welding easily. Solar panel manufactures struggle with the weld attachment. Welding flat leads to round axial leads causes reliability and weld consistency problems. An easier more reliable method is desired.

Integrated circuits generate heat during operation due to conduction losses. This heat must be dissipated from the device for proper functioning. Axial leaded diodes in particular are very difficult to heat sink to the panel and remove the heat efficiently. Solar panel manufactures have been struggling with thermal problems associated with the axial leaded diodes. A device that can be more efficiently heat sunk is desired.

Figure 3:
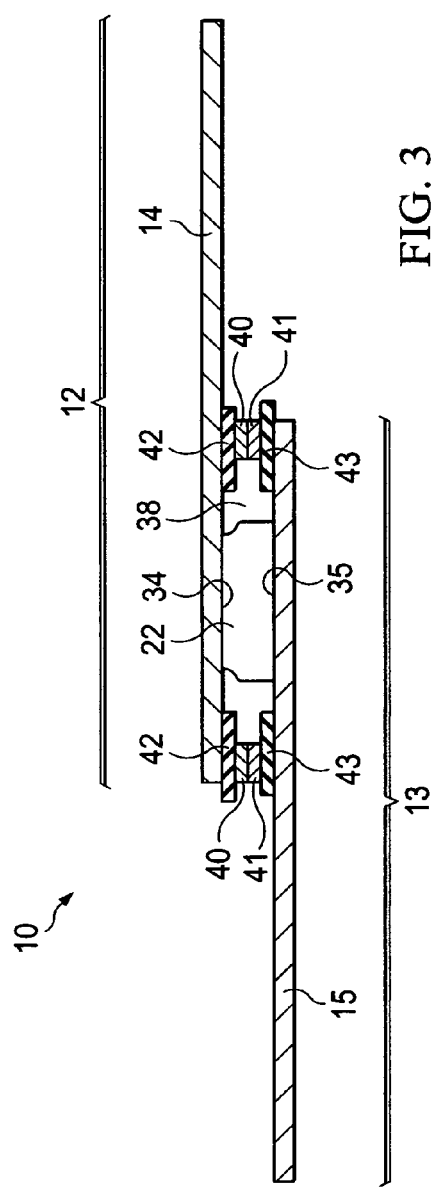
FIG. 3 is a cross sectional view of the microelectronic package taken along line 3-3 in FIG. 2.

Referring to FIG. 1, there is generally shown at 10 a microelectronic device seen to include an integrated circuit interposed between a pair of planar flexible leads 14 and 15 in accordance with one aspect of the present invention. The integrated circuit is seen to comprise a microelectronic circuit 22, such as a die, secured upon the flex leads 14 and 15, as shown. Polyimide isolation rings 42 and 43 and copper seal area rings 40 and 41 provide a pseudo-hermetic seal around die 22 between upper planar flexible lead 14 and lower planar flexible lead 15. In one preferred embodiment, a polyimide isolation ring 42 is affixed proximate one end of a planar flexible lead 14 with a copper seal area ring 40 affixed atop the polyimide isolation ring 42 forming half a die attach cavity 38 as seen in FIG. 3. Planar flexible lead 14 (15), polyimide isolation ring 42 (43), and copper seal area ring 40 (41) are typically sold as one assembly 12 (13), two of which and a die 22 are required to form the microelectronic device 10. The upper assembly 12, although structurally identical to lower assembly 13, is inverted and rotated 180° from lower assembly 13 such that the ends of planar flexible leads 14 and 15 point in opposite directions and copper seal area rings 40 and 41 abut to create a die attach cavity 38, as seen in FIG. 3, wherein the die 22 is secured to planar portions of planar flexible leads 14. In a second preferred embodiment, planar construction is utilized where the top and bottom assemblies 12 and 13 are not identical.

Advantageously, the planar flexible leads 14 and 15 are each formed as a thin sheet such as they are configured to flex, particularly during mechanical stress and during extreme thermal cycling. The planar flexible leads 14 and 15 may be formed as a membrane, but may have other shapes and profiles, and have an electrically conductive portion permitting electrical signals to pass from the die 22 to another member coupled to the respective flexible leads 14 and 15. According to one embodiment of the present invention, the entire flexible leads 14 and 15 are comprised of a thin planar sheet of an electrically conductive member, such as a metal or metal alloy, such as copper, gold or silver, although other materials are possible and within the scope of the present invention. In another embodiment, the flexible lead can be comprised of an electrically conductive member formed on another material, such as a backing member. In one preferred embodiment, the thickness of the flexible leads 14 and 15 are 0.003", but may have a thickness of up to 0.03", depending on the desired electrical and thermal conductivity of the material, the desired flexibility, and compliance in its intended environment. The microelectronic device may be received in and tested in a test fixture shown.

Figure 2:
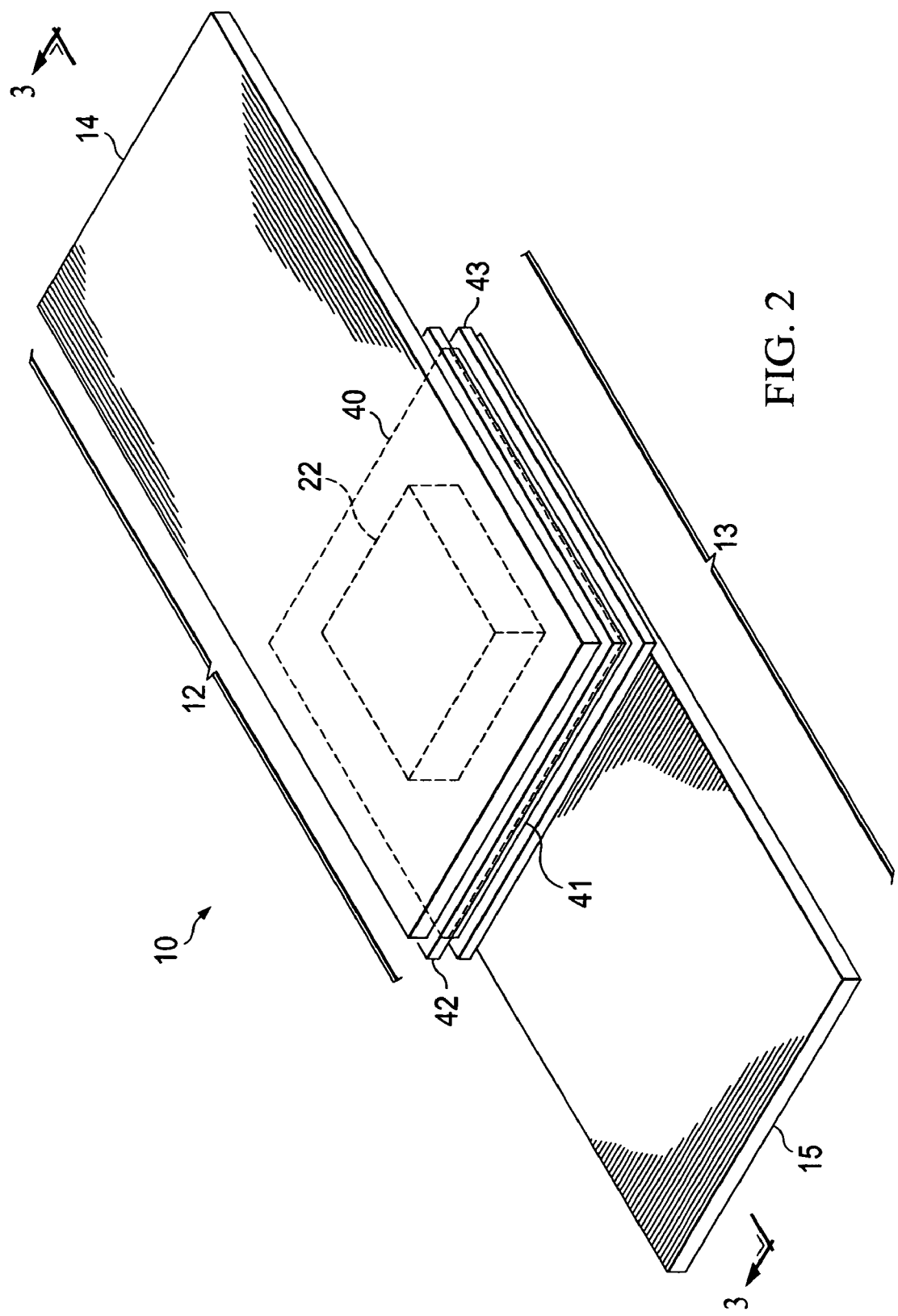
FIG. 2 is a perspective view of the microelectronic package of FIG. 1.

Referring now to FIG. 2, there is shown a perspective of the assembled microelectronic device 10 in accordance with one aspect of the present invention. Microelectronic device 10 is seen to include two assemblies 12 and 13, each consisting of one collinear planar flexible lead 14 or 15, one copper seal area ring 40 or 41, and one polyimide isolation ring 42 or 43, configured to sandwich the die 22.

Referring now to FIG. 3, there is shown a cross sectional view of the microelectronic device 10 taken along line 3-3 in FIG. 2 in accordance with one aspect of the present invention. The die 22 is seen to have a lower major surface 35 secured to a top planar surface of the lower flexible lead 15, such as by welding, soldering, brazing, electrically conductive adhesive, or other well known techniques used to join an integrated circuit base to an electrode. The die 22 is also seen to have an upper major surface 34 having secured to a bottom planar surface of the upper flexible lead 14, such as by welding, soldering, brazing, electrically conductive adhesive, or other well known techniques used to join an integrated circuit base to an electrode. Polyimide isolation rings 42 and 43 are seen to be secured about the perimeter of die 22 disposed upon the top and bottom planar surfaces of flexible leads 14 and 15 with copper seal area rings 40 and 41 disposed upon the polyimide isolation rings 42 and 43 and abutting each other to form the die attach cavity 38 about the die 22, as shown. Polyimide isolation rings 42 and 43 and copper seal area rings 40 and 41 function as a mechanical buffer between the integrated circuit chip 22 and the ends of flexible leads 14 and 15 to isolate the mechanical stress in the lead 14 and 15 from the integrated circuit chip 22. Copper seal area rings 40 and 41 are joined together, by soldering, brazing, or adhesive, to form a pseudo-hermetic seal around die 22. All the members of device 10 have very similar coefficients of thermal expansion such that the members are not overly strained or compressed with respect to one another during extreme thermal cycling.

Figure 4:
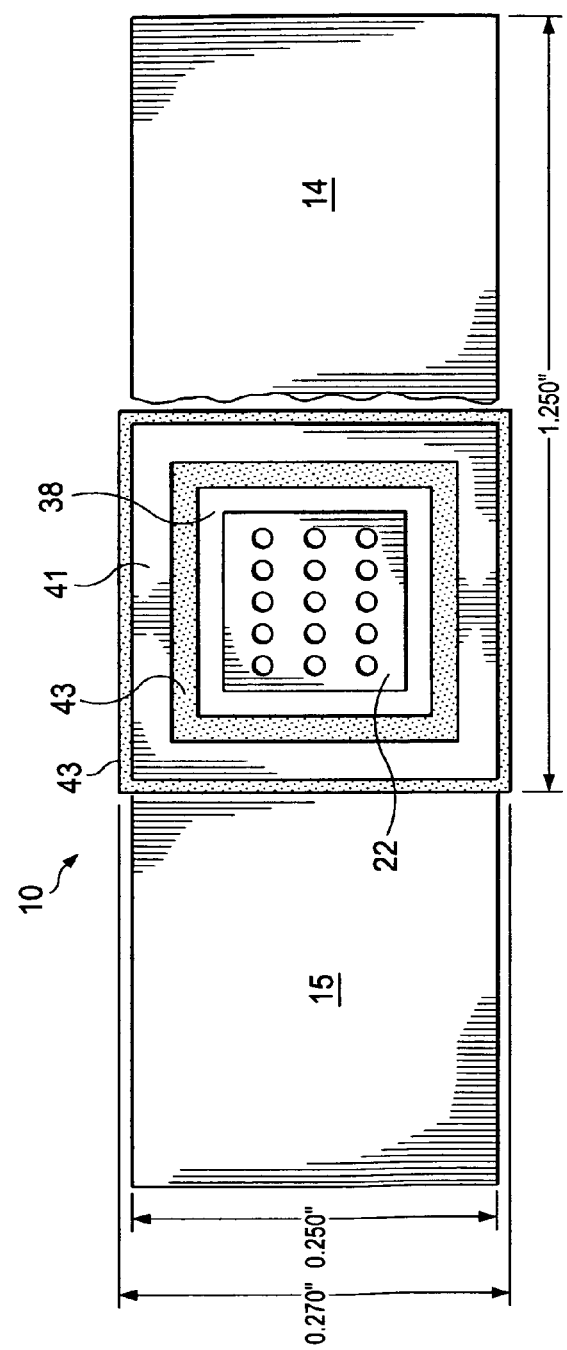
FIG. 4 is a top view of one illustrative example of the microelectronic package with the top lead cut away for better view and shown with dimensions.

Referring now to FIG. 4, there is shown a top view with the top assembly 12 cut away for a better view in accordance with one aspect of the present invention. With the top planar flexible lead 14, the upper polyimide isolation ring 42, and the upper copper seal area ring 40 cut away, it is easier to see the die 22 (shown by the dots) in the cavity 38 formed by lower polyimide isolation ring 43 (shown by the shaded ring) and the lower copper seal area ring 41 (shown by outer white ring) affixed atop the lower polyimide isolation ring 43. In the embodiment shown in FIG. 4, the planar flexible members 14 and 15 have a width of 0.250", the polyimide isolation ring 43 has a width of 0.270" and entire microelectronic device has a length of 1.250", however, limitation to this exact dimension is not to be inferred.

Figure 5:
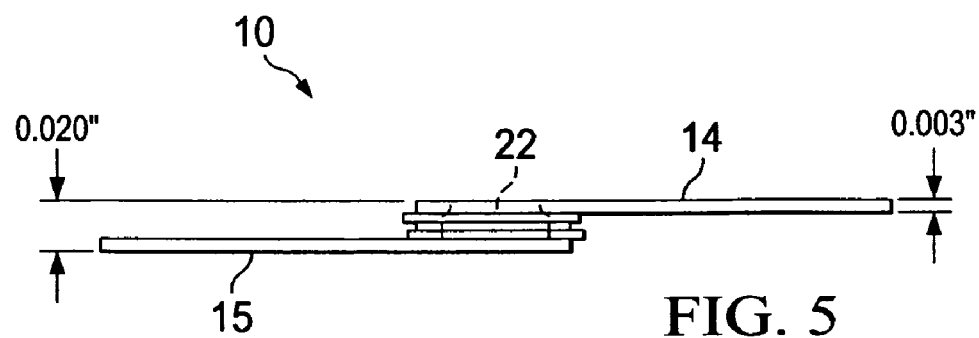
FIG. 5 is a side view of one illustrative example of the microelectronic package as shown with dimensions.

Referring now to FIG. 5, there is shown a side view of the microelectronic device in accordance with one aspect of the present invention. In the embodiment shown in FIG. 5, the die 22 may have a thickness of 0.014" and the planar flexible leads 14 and 15 may have a thickness of 0.003" each, for a total thickness of approximately 0.020", however, limitation to this exact dimension is not to be inferred.

Figure 6:
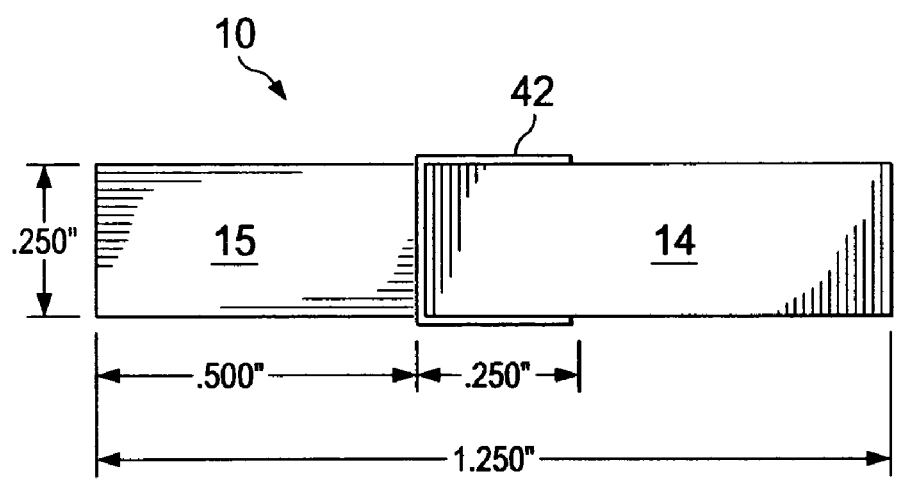
FIG. 6 is a top view of one illustrative example of the microelectronic package as shown with dimensions.
Figure 7:
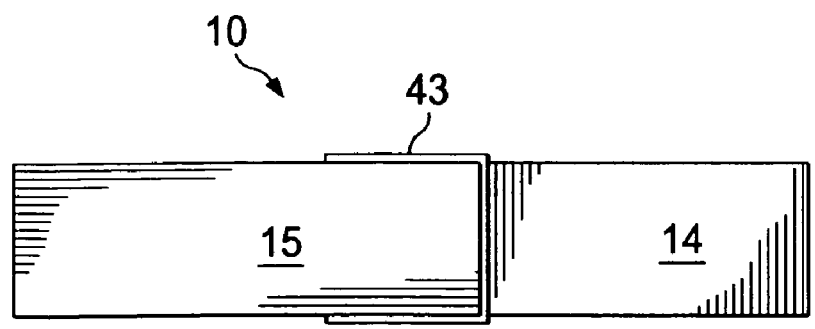
FIG. 7 is a bottom view of the illustrative example of the microelectronic package as shown in FIG. 6.

Referring now to FIGS. 6 and 7, there are shown top and bottom views of the microelectronic device in accordance with one aspect of the present invention.

One critical limitation is the thickness of the flexible leads 14 and 15. It is advantageous that the planar flexible leads 14 and 15 be comprised of a suitable material and have a suitable thickness such that it has enough mechanical strength to secure the die 22 to another member, such as directly to a solar panel, yet which is thin enough to achieve flexibility to withstand mechanical stress, such as during a solar panel application in extreme desert environments, without degradation or tearing. Therefore, it is desired that the planar flexible leads have a thickness of no greater than about 0.003", however, limitation to this exact dimension is not to be inferred.

The planar flexible leads 14 and 15 may form ribbon leads which may be bent or even twisted if necessary during attachment to a recipient member, such as a solar cell panel, or during use. The planar flexible leads achieve technical advantages over conventional rigid axial leads in that these planar leads are adapted to be weldable, which is the preferred method of attachment for devices experiencing extreme thermal cycling, such as that needed in a desert environment. Axial leads are not ideally suitable for welding.

Although one preferred embodiment of the flexible planar leads 14 and 15 is an electrically conductive material, such as a metal, alloy or other material, these leads may be comprised of more than one material, such as multilayer members comprised of same or different materials if desired. For instance, the leads may be comprised of two planar members joined along their major surfaces, or even a strip of a first material upon a planar second material. Therefore, limitation to a planar flexible lead comprised of a single material is not to be inferred.

The die 22 may comprise of a solar diode, and may also comprise of other integrated circuit designs if desired, such as an amplifier, sensor, or other electrical devices. In the case of a diode, the upper flexible lead 14 may be connected to the anode, and the lower flexible lead 16 may be connected to the cathode of the diode. The assemblies 12 and 13 may be hermetically sealed, or semi-hermetically sealed if desired. The device 10 is scalable in size to fit most any die size. The device 10 is flat and very low profile due to its planar design, further facilitating the device to be directly mounted to a solar panel as desired. A key advantage of the device being very thin is that it can be integrated into the solar panel, either next to the solar cells themselves for rigid panels or attached directly to flexible thin-film solar cells.

Various silicon diode chips may be used in the package, and may be usable for blocking applications and by-pass applications. The device is also suitable for use with the new flex solar cell panels currently deployed in space. The device can be heatsunk directly to the solar panel for solar management. Advantageously, the die junction is protected from sunlight reducing reverse leakage power loss. Large dies may also be used to provide lower Vf since less heat is generated. Schottky dies can also be used for extremely low Vf applications. The device can withstand thermal cycles between −20° C. and +80° C.

Referring now to FIG. 8 there is shown another embodiment at 50 seen to comprise a packaged microcircuit device 22. This package 50 is similar to package 10 shown in FIGS. 1-7 and described previously, wherein like numerals refer to like elements. Specifically, solar diode 22 is packaged between a first planar flexible electrode 15 and a second planar flexible electrode 14, wherein the second bottom electrode 15 may comprise a cathode and the second top electrode may comprise an anode.

According to this embodiment, there is shown a bottom member 54 forming a rectangular ring about a recess 56, which member 54 is preferably comprised of a polyimide with adhesive on both sides, preferably comprised of an acrylic adhesive. This member 54 had a generally annular shape, which forms the corresponding recess 56 when adhered to the top surface of the flexible electrode 15.

Likewise, there is an annular polyimide member 42 adhered to the bottom surface of the top flexible electrode 14 forming a corresponding recess 58. Both recesses 56 and 58 are aligned to be opposed one another and receive the silicon die 22 therein in a sandwich like arrangement, as shown.

According to one aspect of the present invention there is shown an annular polyimide member 59 configured to be interposed between members 52 and 54 that has an adhesive disposed on both sides thereof and facing the major surfaces of the adjacent members 52 and 54. Annular member 59 has an opening 61 defined therein configured to receive a silicon die 22, and aligned with recesses 56 and 58 as shown.

Still referring to FIG. 8, there is shown a first solder preform 60 configured to be disposed in recess 56 beneath die 22. There is also shown a second solder preform 62 disposed above the die 22 and positioned in recess 58. In some embodiments, a metal spacer 64, such as a copper spacer, and an additional third solder preform 66 is provided on top of die 22, whereby the spacer member 64 is sandwiched between the opposing solder preform 62 and 66, as shown. The spacer 64 and the third solder preform 66 may be included in packages depending on the thickness of the die 22. When the package is fully assembled, as shown in FIG. 9 and the process of which will be described shortly, the die 22 is mechanically connected and thermally connected to the leads 14 and 15 via the respective solder material when melted, and the polyimide members 52, 54 and 59 form a annular seal about the die 22, as shown in FIG. 9. In some embodiments where the die 22 has a thickness corresponding to the aggregate thickness of the members 52, 54 and 59, such as a P-N junction device, the spacer 64 and the third solder preform 66 are not required or utilized.

One technical advantage of the package shown at 50 in FIG. 8 is that all elements may be assembled in an assembly fixture, and heated in a single step to both melt the solder preforms 60, 62 and 66 and also cure the adhesive of at least the interposed polyimide member 59 to form a seal about the die 22. For instance, the adhesive may be an acrylic adhesive, or other adhesive as desired, and the solder preforms may be high temperature solder. Prior to heating, the adhesive on both sides of member 59 is in a state referred to as "B-stage" which means that the adhesive is dry to the touch and can be easily handled in the assembly of the package.

In one preferred embodiment the solder preforms may be configured to melt at 280° Celsius.

In one preferred embodiment, the polyimide member 59 may be eliminated altogether, whereby the thickness of one or both polyimide members 52 and 54 may be increased, and the exposed surfaces thereof provided with the adhesive such that they cure when heated. One advantage of utilizing the polyimide member 59 is that the respective polyimide members 52 and 54 can be first adhered to the respective members 14 and 15 and cured prior to assembly of the package elements in an assembly fixture as shown in FIG. 8.

Referring to FIG. 9, there is shown that the package 50, when assembled, it is planar whereby a cavity 70 formed therein is created by the respective recesses 56 and 58, and opening 61 and having a width greater than the width of the die 22 as shown. Also shown in FIG. 9 is that one side of the polyimide member 52 and 54 overlaps a portion of the adjacent polyimide member 59 as shown, if desired.

Method of Assembly

The advantages of the previously described package will become more apparent upon the description of one preferred process for integrating the package whereby a single temperature cycle is utilized to both melt the solder and cure the adhesives of the polyimide member(s). Referring to FIG. 8, the various members are integrated in an assembly fixture (not shown).

In a first step the copper electrode 15 is made of a flex circuit material and is placed in the assembly fixture for alignment. The respective polyimide will bring 54 was previously bonded thereto with an acrylic based adhesive. In one preferred embodiment, the cooper electrode 15 may have a thickness of about 3 mil, and the polyimide member 54 may have a thickness of 5 mil. Next, the solder preform 60 is placed on the copper electrode 15 in the spacing 56 which may be a window etched into the polyimide 54 in one preferred embodiment.

Next, the semiconductor die 22 is placed on the solder preform 60.

Next, the polyimide ring 59 with adhesive is aligned with and placed upon the polyimide ring 54.

Next, a second solder preform 62 is placed on the die 22.

Next, in some embodiments, such as when die 22 is a Schottky die, the copper spacer 64 is placed on solder preform 62, and a third solder preform 66 is placed upon the copper spacer 62. The inclusion of copper spacer 64 and third preform 66 may not be required, such as when the die is a P-N junction device.

Thereafter, the top copper electrode 14 is placed, with the respective polyimide ring 52 facing down, over the polyimide ring 59, and then this assembled stack of elements is clipped with a squeezing force to squeeze the elements together and in contact with one another. For instance, a squeezing force of two lbs may be provided.

Advantageously, the assembly stack is not put thru a furnace such as a belt or tunnel furnace at a predetermined temperature for a predetermined amount of time. This single step both pre-cures the adhesive material on both sides of polyimide member 59 and also melts the solder preforms 60 and 62, and 66 if provided. For instance, the furnace may have a temperature of about 360° Celsius, and the stack may be heated for about 10 minutes. The solder preforms in this embodiment melt at 280° Celsius which makes the solder connection between the die 22 and the respective electrodes 14 and 15 while at the same time the adhesive on both sides of member 59 pre-cure to make a seal about the enclosed die 22 as shown in FIG. 9.

Finally, assembly, comprising package 50, is post-cured in an oven at a predetermined temperature for a predetermined time, such as 200° Celsius for one hour to complete curing the adhesive of member 59.

Figure 10:
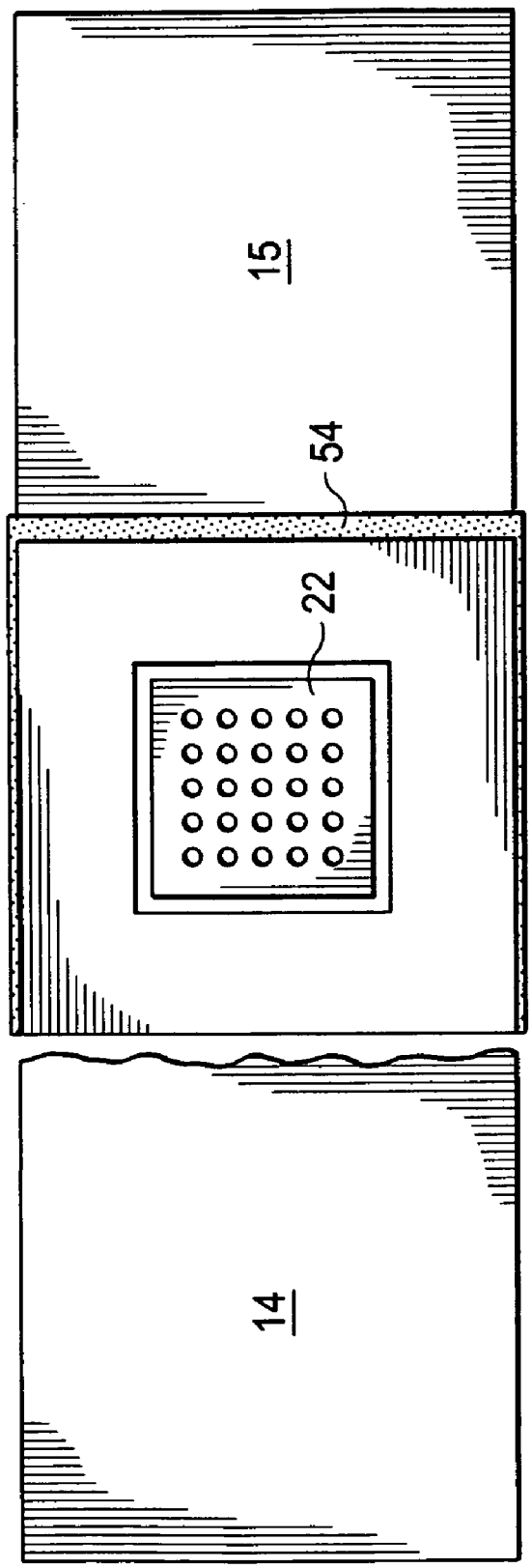
FIG. 10 is a top cut away view of the package of FIG. 9.

Referring to FIG. 10, the assembled top electrode 14 is cut away to depict the die 22 encompassed by the polyimide members in cavity 70.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A method of packaging an integrated circuit with a first lead and a second lead, the method comprising the steps of:
    disposing a first member upon the first lead to define a recess;
    disposing a first solder preform in the recess; disposing a die upon the first solder preform;
    disposing a second solder preform upon the die;
    disposing a second member upon the first member;
    disposing the second lead upon the second member and over the die; and
    heating all of the above elements at a predetermined temperature to simultaneously both melt the first and second solder preforms and also seal the first and second members to each other to form a seal about the die in a single step.

2. The method as specified in claim 1 wherein at least one of the first or second members comprises a polymide.

3. The method as specified in claim 2 wherein the polymide includes an adhesive.

4. The method as specified in claim 3 wherein the adhesive is an acrylic based adhesive.

5. The method as specified in claim 1 wherein both the first and second members comprise a polymide.

6. The method as specified in claim 5 wherein both of the first and second members comprise an adhesive.

7. The method as specified in claim 6 wherein both the first lead and the second lead are planar flexible leads.

8. The method as specified in claim 7 further comprising disposing a spacer member upon the second solder preform.

9. The method as specified in claim 8 further comprising disposing a third solder perform upon the spacer member.

10. The method as specified in claim 7 wherein further comprising disposing a third member between the first member and the second member.

11. The method as specified in claim 10 wherein the first member is bonded to the first planar flexible lead, and the second member is bonded to the second planar flexible lead, before the third member is disposed between the first member and the second member.

12. The method as specified 11 wherein the first member, the second member, and the third member are comprised of polymide.

13. The method as specified in claim 12 wherein the third member includes an adhesive.

14. The method as specified in claim 13 wherein the adhesive is an acrylic adhesive.

15. The method as specified in claim 7 wherein the die is a solar diode.

16. The method as specified in claim 6 wherein the predetermined temperature is greater than a melting temperature of the solder preforms and the adhesive.

17. The method as specified in claim 16 wherein the predetermined temperature is greater than about 300 degrees Centigrade.

18. The method as specified in claim 1 wherein the first lead comprises a cathode and the second lead comprises an anode.

19. The method as specified in claim 1 wherein all the elements are compressed in a stack while heated.

20. The method as specified in claim 1 wherein all the elements are assembled in an assembly fixture.

* * * * *